(12) United States Patent
Holm et al.

(10) Patent No.: US 10,215,653 B2
(45) Date of Patent: Feb. 26, 2019

(54) SIGNAL INTERFACE CIRCUIT AND PRESSURE SENSOR SYSTEM INCLUDING SAME

(71) Applicant: NXP USA, INC., Austin, TX (US)

(72) Inventors: Paige M. Holm, Phoenix, AZ (US); Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 139 days.

(21) Appl. No.: 15/480,508

(22) Filed: Apr. 6, 2017

(65) Prior Publication Data

US 2018/0292280 A1 Oct. 11, 2018

(51) Int. Cl.
| | |
|---|---|
| *G01L 9/06* | (2006.01) |
| *G01L 9/08* | (2006.01) |
| *G06G 7/14* | (2006.01) |
| *H01L 41/113* | (2006.01) |

(52) U.S. Cl.
CPC .............. *G01L 9/08* (2013.01); *G01L 9/06* (2013.01); *G06G 7/14* (2013.01); *H01L 41/1132* (2013.01)

(58) Field of Classification Search
CPC ..... G01L 19/147; G01L 9/0042; G01L 19/04; G01L 9/0072; G01L 13/025; G01L 9/0054; G01L 9/0075; G01L 19/0038; G01L 19/0084; G01L 19/14; G01L 19/0069; G01L 19/0618; G01L 19/0645; G01L 9/0052
USPC .................................................. 73/700–756
See application file for complete search history.

(56) References Cited

U.S. PATENT DOCUMENTS

| 3,130,301 A | 4/1964 | Minter | |
|---|---|---|---|
| 2018/0175804 A1* | 6/2018 | Wang | ........................ H03F 1/26 |

FOREIGN PATENT DOCUMENTS

| EP | 2458359 A1 | 5/2012 |
|---|---|---|
| JP | H10213503 A | 8/1998 |

OTHER PUBLICATIONS

Rajavelu, Muthapillai et al; "Enhanced sensitivity with extended linearity in MEMS piezoresistive pressure sensor"; Micro & Nano Letters, vol. 8, Issue 10; 4 pages (2013).
U.S. Appl. No. 15/424,994,38 pages, filed Feb. 6, 2016.
U.S. Appl. No. 15/382,692, 25 pages, filed Dec. 18, 2016.

* cited by examiner

*Primary Examiner* — Andre Allen
(74) *Attorney, Agent, or Firm* — Charlene R. Jacobsen

(57) ABSTRACT

A sensor includes groups of sense elements coupled to one another to form multiple Wheatstone bridges, each being configured to produce an output voltage across first and second output nodes. A signal interface circuit for the sensor includes switched capacitor structures, one each of the switched capacitor structures being associated with one each of the Wheatstone bridges. Each switched capacitor structure includes a capacitor having first and second terminals, a first switch for selectively interconnecting the first node of an associated Wheatstone bridge with the first terminal of the capacitor, and a second switch for selectively interconnecting the second node of the associated Wheatstone bridge with the second terminal of the capacitor. A switch state element toggles the first and second switches between a charge state and a readout state to provide a readout voltage that is equivalent to a summation of the voltage outputs of the Wheatstone bridges.

20 Claims, 5 Drawing Sheets

SIGNAL INTERFACE CIRCUIT AND PRESSURE SENSOR SYSTEM INCLUDING SAME

TECHNICAL FIELD OF THE INVENTION

The present invention relates generally to microelectromechanical systems (MEMS) pressure sensors. More specifically, the present invention relates to a MEMS pressure sensor system having a multiple Wheatstone bridge configuration of sense elements and a signal interface circuit for combining the Wheatstone bridge output signals.

BACKGROUND OF THE INVENTION

Conventional piezoresistive pressure sensors are formed by a Wheatstone bridge that includes four piezoresistors. These four piezoresistors are placed near the edge of a deformable membrane, i.e., a diaphragm, where the stress change is high under external pressure. Of the four piezoresistors, two are oriented to provide an increase in resistance when external pressure is applied to the diaphragm and two are oriented to provide a decrease in resistance under the same applied external pressure. Accordingly, the output of the Wheatstone bridge is a differential voltage that changes with external applied pressure.

In general, there are two types of pressure sensor designs based on Wheatstone bridges. One type of design places all four piezoresistors of the Wheatstone bridge proximate one edge of the diaphragm. The other type of design places one piezoresistor of the Wheatstone bridge on each of the four edges of the diaphragm. In either configuration, an electronic circuit detects the resistance changes of the piezoresistive bridge and outputs an electrical signal representative of the external applied pressure.

Increasing the sensitivity of a pressure sensor may provide improved resolution and therefore yield improved device performance. Device sensitivity may be increased by increasing the lateral dimensions of the diaphragm. That is, a bigger diaphragm can provide higher deflection under a given applied external pressure and generate more change in stress at the piezoresistor locations. More change in stress at the piezoresistor locations produces a larger electrical output, therefore increased sensitivity. However, a larger diaphragm has the disadvantages of more fragile die/wafer, larger die size/higher cost, and degraded linearity performances.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a signal interface circuit for a sensor, and pressure sensor system including the signal interface circuit that may enable enhanced sensor performance in terms of increased sensitivity and robustness to process variation. More particularly, the pressure sensor system includes a multiple Wheatstone bridge configuration of sense elements and the signal interface circuit for combining output signals of the multiple Wheatstone bridges. The signal interface circuit includes an array of switched capacitors and a two-stage readout mechanism. A two-stage interrogation of the Wheatstone bridges is implemented to include an initial querying and storage of the individual bridge output voltages in storage capacitors (i.e., a first "charge" state), followed by a serial interconnection of the storage capacitors in a second "readout" state to generate a readout voltage. The readout voltage is a summed output signal of all of the Wheatstone bridges that is generated when the storage capacitors are serially connected.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions.

Figure 1:
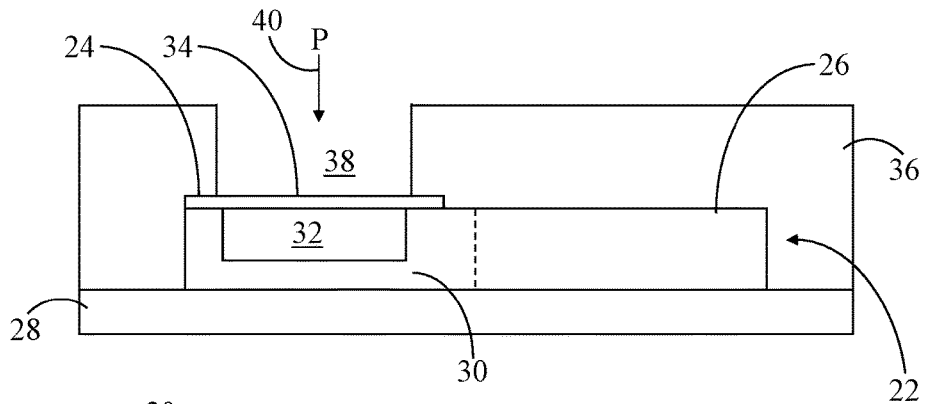
FIG. 1 shows a side view of a pressure sensor system in a simplified form.

Referring to FIG. 1, FIG. 1 shows a side view of a pressure sensor system 20 in a simplified form. In general, pressure sensor system 20 may be formed as a single die 22 that includes a microelectromechanical systems (MEMS) pressure sensing portion 24 and an application specific integrated circuit (ASIC) portion 26 in electrical communication with pressure sensing portion 24. Die 22 may, in some configurations, be coupled to a common base 28. For simplicity of illustration pressure sensing portion 24 is delineated from ASIC portion 26 by a dashed line. However, those skilled in the art will recognize that pressure sensing portion 24 and ASIC portion 26 may be integrated in any suitable configuration (for example, pressure sensing portion 24 may be formed on top of ASIC portion 26). Thus, in the illustrated configuration, pressure sensor system 20 represents an integrated transducer package in which pressure sensing portion 24 is directly incorporated with ASIC portion 26. However, alternative embodiments may entail a pressure sensing element that is fabricated and packaged separately from the associated ASIC die.

Pressure sensing portion 24 generally includes a substrate 30 having a cavity 32. A deformable membrane, referred to herein as a diaphragm 34, is suspended across cavity 32. In some embodiments, die 22 may be encapsulated in a molding compound 36. A port 38 may thus extend through molding compound 36 so as to expose diaphragm 34 of pressure sensing portion 24 to an external applied pressure, P, 40. Under external applied pressure 40, diaphragm 34 deforms. Die 22 thus detects the resistance changes of piezoresistors (discussed below) provided in diaphragm 34 and outputs an electrical signal representative of external applied pressure 40. Although an overmolded die configuration is shown, it should be understood that other configurations may entail a cavity package, a chip scale package, or any other suitable package.

Figure 2:
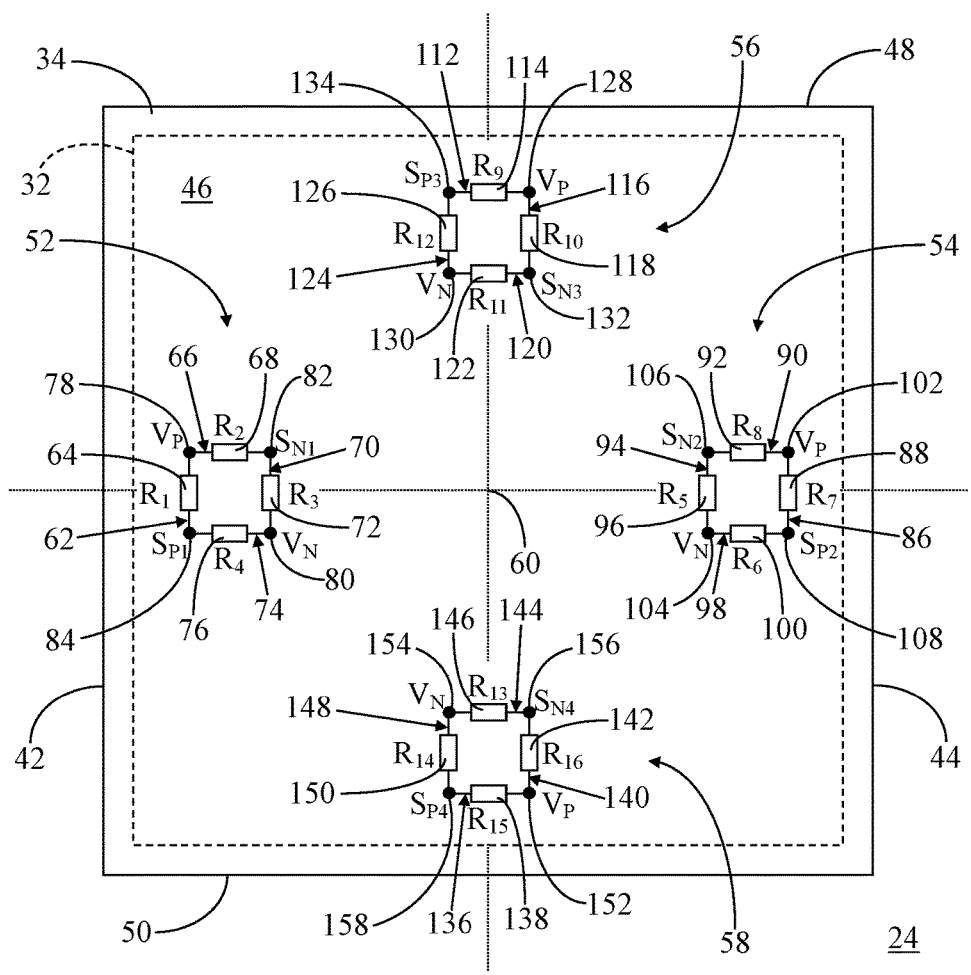
FIG. 2 shows a top view of a pressure sensing portion of the pressure sensor system of FIG. 1.

FIG. 2 shows a top view of pressure sensing portion 24 of pressure sensor system 20 (FIG. 1). In particular, pressure sensing portion 24 includes diaphragm 34 with a plurality of sense elements, e.g., piezoresistors, provided therein. Diaphragm 34 has a first outer edge 42 and a second outer edge 44 disposed on opposing sides of a surface 46 of diaphragm 34. Diaphragm 34 further has a third outer edge 48 and a fourth outer edge 50 disposed on opposing sides of surface 46 of diaphragm 34 and interposed between first and second outer edges 42, 44. Thus, surface 46 is circumscribed by first, second, third, and fourth outer edges 42, 44, 48, 50. A dashed line box represents the outer perimeter of cavity 32 underlying diaphragm 34. Although a rectangular diaphragm 34 is shown, diaphragm 34 may be round, oval, or any other suitable shape in other embodiments.

The stress levels may be higher near the edges of the region above cavity 32. In the illustrated configuration, the edges of the region above cavity 32 are approximately along the perimeter of diaphragm 34, i.e. near first, second, third, and fourth outer edges 42, 44, 48, 50 relative to other regions of diaphragm 34. Thus, in an embodiment, pressure sensing portion 24 includes multiple Wheatstone bridge circuits. Each of the Wheatstone bridges includes four sense elements in the form of piezoresistors, with the four piezoresistors being placed together in a localized manner near one outer edge of diaphragm 34. In this example, a first group of piezoresistors is provided in diaphragm 34 proximate first outer edge 42 of diaphragm 34. The piezoresistors of the first group are coupled to one another to form a first Wheatstone bridge 52. A second group of piezoresistors is provided in diaphragm 34 proximate second outer edge 44 of diaphragm 34. The piezoresistors of the second group are coupled to one another to form a second Wheatstone bridge 54. Similarly, a third group of piezoresistors is provided in diaphragm 34 proximate third outer edge 48 of diaphragm 34. The piezoresistors of the third group are coupled to one another to form a third Wheatstone bridge 56. A fourth group of piezoresistors is provided in diaphragm 34 proximate fourth outer edge 50 of diaphragm 34. The piezoresistors of the fourth group are coupled to one another to form a fourth Wheatstone bridge 58.

Each of first, second, third, and fourth Wheatstone bridges 52, 54, 56, 58 is approximately equidistant from its respective, first, second, third, and fourth outer edges 42, 44, 48, 50. In an ideal configuration, diaphragm 34 would be centered over cavity 32 (as shown in FIG. 2) so that each of first, second, third, and fourth Wheatstone bridges 52, 54, 56, 58 is subject to approximately the same stress level on surface 46 of diaphragm 34 as a function of the distance from a center 60 of cavity 32 in response to external applied pressure 40 (FIG. 1).

With particular reference to the structure and arrangement of the Wheatstone bridges, first Wheatstone bridge 52 includes a first leg 62 having a first piezoresistor 64, labeled $R_1$, a second leg 66 having a second piezoresistor 68, labeled $R_2$, a third leg 70 having a third piezoresistor 72, labeled $R_3$, and a fourth leg 74 having a fourth piezoresistor 76, labeled $R_4$. First and fourth piezoresistors 64, 76 are coupled in series to form a first half of first Wheatstone bridge 52. Second and third piezoresistors 68, 72 are coupled in series to form a second half of first Wheatstone bridge 52. The first half of first Wheatstone bridge 52 is coupled in parallel with the second half of first Wheatstone bridge 52 such that a node between first and second piezoresistors 64, 68 forms a first positive input node 78, labeled $V_P$, and a node between third and fourth piezoresistors 72, 76 forms a first negative input node 80, labeled $V_N$. In accordance with the Wheatstone bridge configuration, a node between second and third piezoresistors 68, 72 forms a first output node 82, labeled $S_{N1}$, and a node between first and fourth piezoresistors 64, 76 forms a second output node 84, labeled $S_{P1}$. The nomenclature "first" with respect to the specific nodes and the subscript "1" is used herein to correlate with first Wheatstone bridge 52. It can be readily observed that first and third legs 62, 70 are oriented substantially parallel to first outer edge 42 of diaphragm 34. Additionally, second and fourth legs 66, 74 are oriented substantially normal, i.e., perpendicular, to first outer edge 42 of diaphragm 34.

Now with reference to second Wheatstone bridge 54, second Wheatstone bridge 54 includes a first leg 86 having a first piezoresistor 88, labeled $R_7$, a second leg 90 having a second piezoresistor 92, labeled $R_8$, a third leg 94 having a third piezoresistor 96, labeled $R_5$, and a fourth leg 98 having a fourth piezoresistor 100, labeled $R_6$. First and fourth piezoresistors 88, 100 are coupled in series to form a first half of second Wheatstone bridge 54. Second and third piezoresistors 92, 96 are coupled in series to form a second half of second Wheatstone bridge 54. The first half of second Wheatstone bridge 54 is coupled in parallel with the second half of second Wheatstone bridge 54 such that a node between first and second piezoresistors 88, 92 forms a first positive input node 102, labeled $V_P$, and a node between third and fourth piezoresistors 96, 100 forms a second negative input node 104, labeled $V_N$. In accordance with the Wheatstone bridge configuration, a node between second and third piezoresistors 92, 96 forms a third output node 106, labeled $S_{N2}$, and a node between first and fourth piezoresistors 88, 100 forms a fourth output node 108, labeled $S_{P2}$. Again, it can be readily observed that first and third legs 86, 94 are oriented substantially parallel to second outer edge 44 of diaphragm 34. Additionally, second and fourth legs 90, 98 are oriented substantially normal, i.e., perpendicular, to second outer edge 44 of diaphragm 34.

Referring now to third Wheatstone bridge 56, third Wheatstone bridge 56 includes a first leg 112 having a first piezoresistor 114, labeled $R_9$, a second leg 116 having a second piezoresistor 118, labeled $R_{10}$, a third leg 120 having a third piezoresistor 122, labeled $R_{11}$, and a fourth leg 124 having a fourth piezoresistor 126, labeled $R_{12}$. First and fourth piezoresistors 114, 126 are coupled in series to form a first half of third Wheatstone bridge 56. Second and third piezoresistors 118, 122 are coupled in series to form a second half of third Wheatstone bridge 56. The first half of third Wheatstone bridge 56 is coupled in parallel with the second half of third Wheatstone bridge 56 such that a node between first and second piezoresistors 114, 118 forms a first input node 128, labeled $V_P$, and a node between third and fourth piezoresistors 122, 126 forms a second input node 130, labeled $V_N$. In accordance with the Wheatstone bridge configuration, a node between second and third piezoresistors 118, 122 forms a fifth output node 132, labeled $S_{N3}$, and a node between first and fourth piezoresistors 114, 126 forms a sixth output node 134, labeled $S_{P3}$. It can be readily observed that first and third legs 112, 120 are oriented substantially parallel to third outer edge 48 (and hence perpendicular to first and second outer edges 42, 44) of diaphragm 34. Additionally, second and fourth legs 116, 124 are oriented substantially normal, i.e., perpendicular, to third outer edge 48 (and hence parallel to first and second outer edges 42, 44) of diaphragm 34.

Fourth Wheatstone bridge 58 includes a first leg 136 having a first piezoresistor 138, labeled $R_{15}$, a second leg 140 having a second piezoresistor 142, labeled $R_{16}$, a third leg 144 having a third piezoresistor 146, labeled $R_{13}$, and a fourth leg 148 having a fourth piezoresistor 150, labeled $R_{14}$. First and fourth piezoresistors 138, 150 are coupled in series to form a first half of fourth Wheatstone bridge 58. Second and third piezoresistors 142, 146 are coupled in series to form a second half of fourth Wheatstone bridge 58. The first half of fourth Wheatstone bridge 58 is coupled in parallel with the second half of fourth Wheatstone bridge 58 such that a node between first and second piezoresistors 138, 142 forms a first input node 152, labeled $V_P$, and a node between third and fourth piezoresistors 146, 150 forms a second input node 154, labeled $V_N$. In accordance with the Wheatstone bridge configuration, a node between second and third piezoresistors 142, 146 forms a seventh output node 156, labeled $S_{N4}$, and a node between first and fourth piezoresistors 138, 150 forms an eighth output node 158, labeled $S_{P4}$, and. Again, it can be readily observed that first and third legs 136, 144 are oriented substantially parallel to fourth outer edge 50 (and hence perpendicular to first and second outer edges 42, 44) of diaphragm 34. Additionally, second and fourth legs 140, 148 are oriented substantially normal, i.e., perpendicular, to fourth outer edge 50 (and hence parallel to first and second outer edges 42, 44) of diaphragm 34.

The configuration illustrated in FIGS. 1 and 2 is provided as an example in which multiple piezoresistive sense elements are provided at high-stress locations on the diaphragm of a piezoresistive transducer pressure sensor to form multiple Wheatstone bridges. Further, the pressure sensing portion 24 may be directly incorporated with ASIC portion 26 to yield an integrated piezoresistive package 20. As will be discussed in greater detail below the output voltages of the multiple Wheatstone sensing bridge circuits can be combined to achieve overall higher sensitivity, improved signal-to-noise (SNR) performance, and improvements in robustness to process variations. The multiple Wheatstone bridge configuration may be implemented in a wide variety of configurations in which the piezoresistive sense elements are interconnected in either a localized or distributed fashion.

Figure 3:
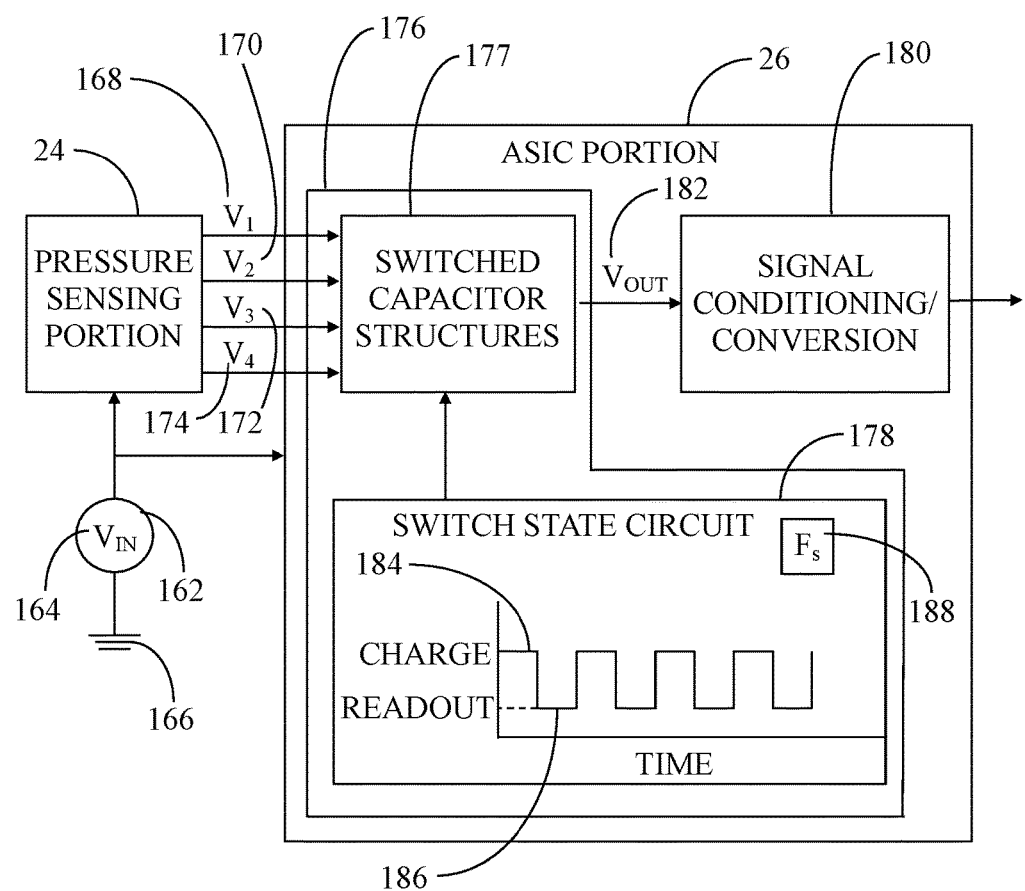
FIG. 3 shows a simplified block diagram of the pressure sensor system of FIG. 1.

Now referring to FIG. 3 concurrently with FIG. 2, FIG. 3 shows a simplified block diagram of pressure sensor system 20 including pressure sensor portion 24 and ASIC portion 26. In this example, pressure sensor portion 24 includes the four Wheatstone bridge configuration of sense elements described in connection with FIG. 1. A single voltage supply 162 provides an input voltage 164, labeled $V_{IN}$, that powers all of first, second, third, and fourth Wheatstone bridges 52, 54, 56, 58. As particularly shown in FIG. 4 all of first, second, third, and fourth Wheatstone bridges 52, 54, 56, 58 are connected in parallel between voltage supply 162 and a system ground 166. Voltage supply 162 may also power ASIC portion 26.

Each of first, second, third, and fourth Wheatstone bridges 52, 54, 56, 58 is configured to produce an output voltage representative of external applied pressure 40 (FIG. 1) across its associated output nodes in response to deformation of diaphragm 34 under the applied external pressure 40. As such, first Wheatstone bridge 52 produces a first output voltage 168 (labeled $V_1$ in FIG. 3) across first and second output nodes 82, 84. Second Wheatstone bridge 54 produces a second output voltage 170 (labeled $V_2$ in FIG. 3) across third and fourth output nodes 106, 108. Third Wheatstone bridge 56 produces a third output voltage 172 (labeled $V_3$ in FIG. 3) across fifth and sixth output nodes 132, 134. And, fourth Wheatstone bridge 58 produces a fourth output voltage 174 (labeled $V_4$ in FIG. 3) across seventh and eighth output nodes 156, 158.

In accordance with an embodiment, ASIC portion 26 includes a signal interface circuit 176 that includes multiple switched capacitor structures 177 and a switch state circuit 178 configured to communicate switched capacitor structures 177. ASIC portion 26 can further include downstream circuitry represented by a signal conditioning/conversion block 180 as known to those skilled in the art. Signal interface circuit 176 is configured to combine first, second, third, and fourth output voltages 168, 170, 172, 174 to produce a readout voltage 182, labeled $V_{OUT}$. Readout voltage 182 may be communicated to signal conditioning/conversion block 180 for further processing, such as amplification, filtering, conversion to a digital signal, and the like. As will become apparent below, switch state circuit 178 may be a clock circuit for toggling switched capacitor structures 177 between a charge state 184 and a readout state 186 at a particular sampling frequency 188.

Figure 4:
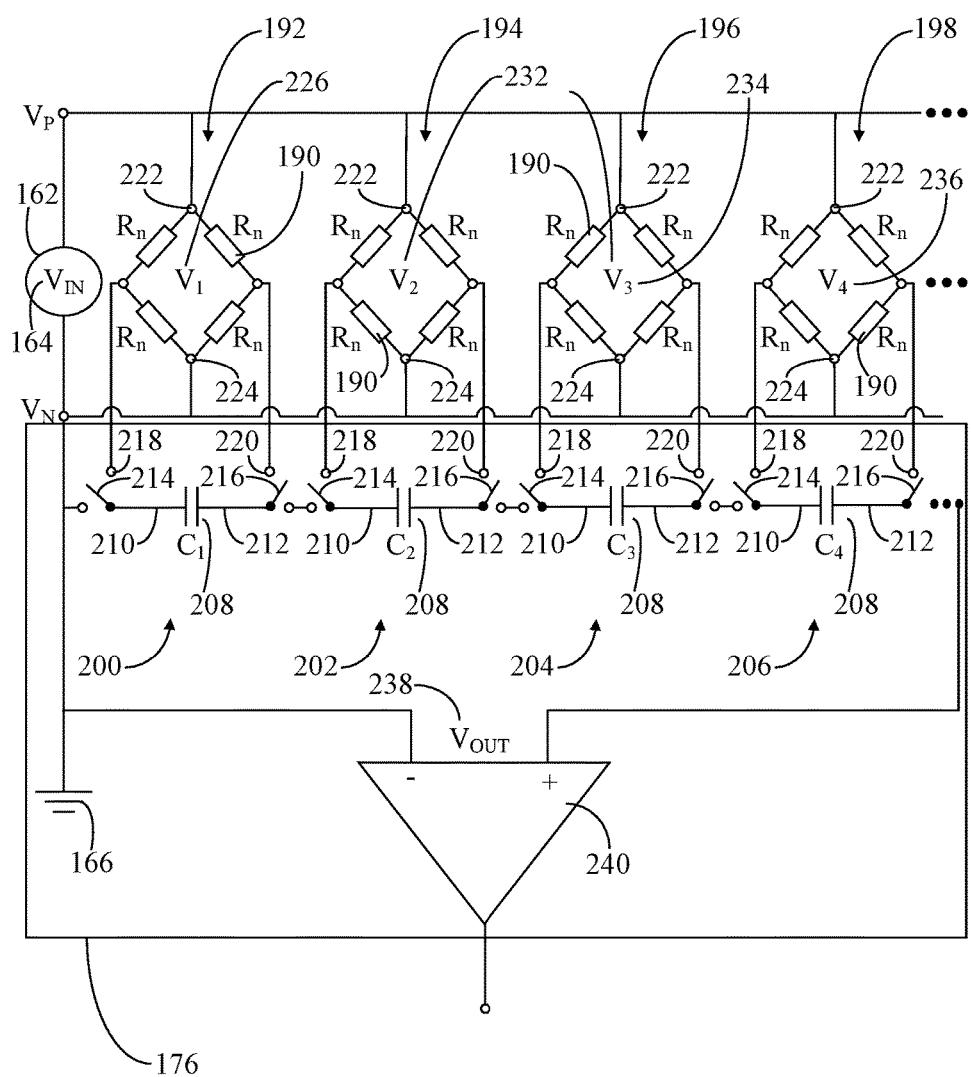
FIG. 4 shows a generalized circuit diagram that includes a multiple Wheatstone bridge configuration and a signal interface circuit of the pressure sensor system of FIG. 3.

Now referring to FIG. 4, FIG. 4 shows a generalized circuit diagram that includes a multiple Wheatstone bridge configuration and signal interface circuit 176 of a pressure sensor system, such as that described in connection with FIGS. 1-3. FIG. 4 represents a generalized technique for combining the voltage outputs from a multiple Wheatstone bridge configuration of sense elements. The technique implements an array of stacked, switched capacitors in signal interface circuit 176 for readout of a sensor's response. Subsequent FIGS. 5 and 6, discussed below, are provided to illustrate a particular example correlated with the multiple Wheatstone bridge configuration of FIG. 2.

FIG. 4 is shown with four groups of sense elements, e.g., piezoresistors 190, suitably coupled to form four Wheatstone bridges 192, 194, 196, 198. It should be observed that ellipses (i.e., three dot punctuation marks) are included in FIG. 4 to denote that there may be more than four interconnected Wheatstone bridges. Alternatively, other configurations may have less than four interconnected Wheatstone bridges.

Signal output circuit 176 includes multiple switched capacitor structures 200, 202, 204, 206. The individual switched capacitor structures are differentiated by the different reference numbers 200, 202, 204, 206 for illustrative purposes. Nevertheless, it should be understood that discussion of switched capacitor structures 200, 202, 204, 206 provides an example embodiment of switched capacitor structures 177 initially mentioned in connection with FIG. 3.

Accordingly, a first switched capacitor structure 200 is associated with a first Wheatstone bridge 192. A second switched capacitor structure 202 is associated with a second Wheatstone bridge 194. A third switched capacitor structure 204 is associated with a third Wheatstone bridge 196, and a fourth switched capacitor structure 206 is associated with a fourth Wheatstone bridge 198. Each of capacitor structures 200, 202, 204, 206 includes a capacitor 208 having a first terminal 210 and a second terminal 212, a first switch 214, and a second switch 216. First switch 214 is configured to selectively interconnect first terminal 210 of capacitor 208 with a first output node 218 of the associated one of Wheatstone bridges 192, 194, 196, 198, and second switch 216 is configured to selectively interconnect second terminal 212 of capacitor 208 with a second output node 220 of the associated one of Wheatstone bridges 192, 194, 196, 198.

Wheatstone bridges 192, 194, 196, 198 are connected in parallel between voltage supply 162 and ground 166. That is, positive input nodes 222 of Wheatstone bridges 192, 194, 196, 198 are interconnected, as well as being connected to voltage source 162. Negative input nodes 224 of Wheatstone bridges 192, 194, 196, 198 are interconnected, as well as, being connected to system ground 166. When input voltage 164 is applied between input nodes 222, 224 of first Wheatstone bridge 192, a first output voltage 226, labeled $V_1$, across first and second output nodes 218, 220 of first Wheatstone bridge 192 changes in response to changes in the values of sense elements 190 of first Wheatstone bridge 192. Similarly, when input voltage 164 is applied between input nodes 222, 224 of second Wheatstone bridge 194, a second output voltage 232, labeled $V_2$, across first and second output nodes 218, 220 of second Wheatstone bridge 194 changes in response to changes in the values of sense elements 190 of second Wheatstone bridge 194. When input voltage 164 is applied between input nodes 222, 224 of third Wheatstone bridge 196, a third output voltage 234, labeled $V_3$, across first and second output nodes 218, 220 of third Wheatstone bridge 196 changes in response to changes in the values of sense elements 190 of third Wheatstone bridge 196. When input voltage 164 is applied between input nodes 222, 224 of fourth Wheatstone bridge 198, a fourth output voltage 236, labeled $V_4$, across first and second output nodes 218, 220 of fourth Wheatstone bridge 198 changes in response to changes in the values of sense elements 190 of fourth Wheatstone bridge 198. Since piezoresistors 190 are formed in the diaphragm of a pressure sensing element, the nominal resistance of each of piezoresistors 190 will change when the diaphragm deflects in response to external pressure 40 (FIG. 1).

In an embodiment, switched capacitor structures 200, 202, 204, 206 form a time-division, two-stage readout circuit for Wheatstone bridges 192, 194, 196, 198. In a first stage, referred to herein as charge state 184 (FIG. 3) driven by switch state circuit 178 (FIG. 3), first and second switches 214, 216 connect each capacitor 208 to its associated one of Wheatstone bridges 192, 194, 196, 198. Under applied external pressure 40 on the diaphragm of the sensor, each of Wheatstone bridges 192, 194, 196, 198 senses the resulting stress and the differential output voltages 226, 232, 234, 236 appears across their respective first and second output nodes 218, 220 connected to capacitor 208. Each capacitor 208 of each of switched capacitor structures 200, 202, 204, 206 is therefore charged to the voltage level, i.e., output voltages 226, 232, 234, 236, of its associated one of Wheatstone bridges 192, 194, 196, 198.

Once the capacitors 208 are fully charged, first and second switches 214, 216 of each of switched capacitor structures 200, 202, 204, 206 toggle to a second stage, referred to herein as readout state 186 (FIG. 3) driven by switch state circuit 178 (FIG. 3), which disconnects Wheatstone bridges 192, 194, 196, 198 from their associated capacitors 208. Further, in readout state 186, capacitors 208 are connected in a series chain. In readout state 186, a readout voltage 238 from the series chain of capacitors 208 is equivalent to the sum of the individual bridge output voltages.

Accordingly, the voltages across capacitors 208, i.e., output voltages 226, 232, 234, 236, can be added to provide readout voltage 238 to a following amplifier 240, as follows:

$$V_{OUT} = V_1 + V_2 + V_3 + V_4 + \ldots + V_N \quad (1)$$

where $V_N$ represents the total number of Wheatstone bridges and associated capacitors of a particular design. For implementations in which the sense elements of each of the Wheatstone bridges and the associated capacitors is nominally identical, readout voltage 238, $V_{OUT}$ can be presumed to be $N*V_N$, where $V_N$ represents the output voltage from an individual one of capacitors 208. However, a nominally identical implementation of sense elements and associated capacitors not a requirement. That is, other implementations may have Wheatstone bridges of sense elements and/or their associated switched capacitors that are different. The signal interface circuit 176 of switched capacitors 208 may still be implemented since readout voltage 238 is a summation of the output voltages across each of capacitors 208.

Figure 5:
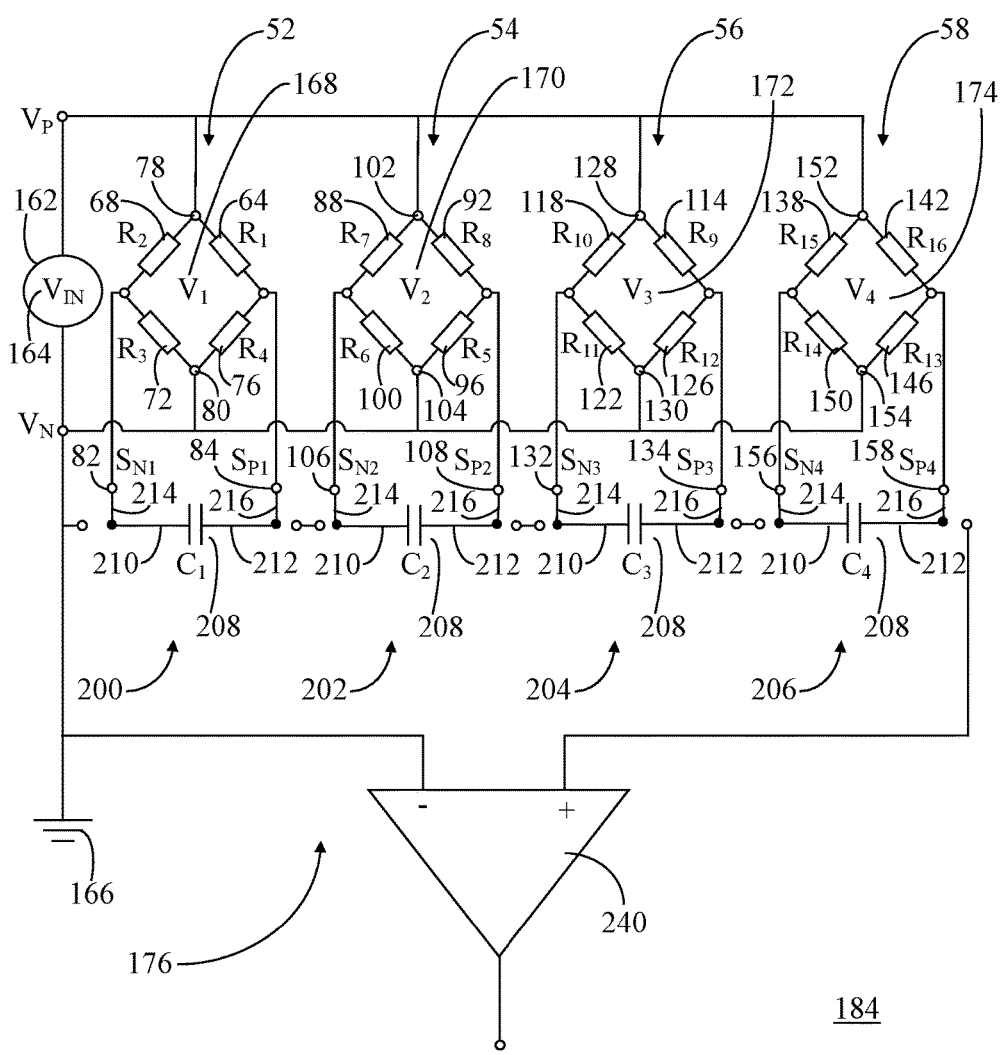
FIG. 5 shows a circuit diagram that includes the pressure sensing portion 24 of FIG. 2 and a signal interface circuit in a charge state in accordance with an embodiment.

Now referring to FIG. 5 for a specific example, FIG. 5 shows a circuit diagram that includes pressure sensing portion 24 and signal interface circuit 176 in charge state 184. In particular, FIG. 5 shows first, second, third, and fourth Wheatstone bridges 52, 54, 56, 58 of pressure sensing portion 24 and their corresponding first, second, third, and fourth switched capacitor structures 200, 202, 204, 206.

First switched capacitor structure 200 includes first capacitor 208, labeled $C_1$, having first and second terminals 210, 212, first switch 214, and second switch 216. In charge state 184, first switch 214 interconnects first output node 82 of first Wheatstone bridge 52 and first terminal 210. Additionally, second switch 216 interconnects second output node 84 of first Wheatstone bridge 52 and second terminal 212. Likewise, second switched capacitor structure 202 includes first capacitor 208, labeled $C_2$, having first and second terminals 210, 212, first switch 214, and second switch 216. In charge state 184, first switch 214 interconnects third output node 106 of second Wheatstone bridge 54 and first terminal 210. Additionally, second switch 216 interconnects fourth output node 108 of second Wheatstone bridge 54 and second terminal 212. Third switched capacitor structure 204 includes first capacitor 208, labeled $C_3$, having first and second terminals 210, 212, first switch 214, and second switch 216. In charge state 184, first switch 214 interconnects fifth output node 132 of third Wheatstone bridge 56 and first terminal 210. Additionally, second switch 216 interconnects sixth output node 134 of third Wheatstone bridge 56 and second terminal 212. Fourth switched capacitor structure 206 includes first capacitor 208, labeled $C_4$, having first and second terminals 210, 212, first switch 214, and second switch 216. In charge state 184, first switch 214 interconnects seventh output node 156 of fourth Wheatstone bridge 58 and first terminal 210. Additionally, second switch 216 interconnects eighth output node 158 of fourth Wheatstone bridge 58 and second terminal 212.

Under applied external pressure 40 (FIG. 1) on pressure sensing portion 24, each of first, second, third, and fourth Wheatstone bridges 52, 54, 56, 58 senses the resulting stress on diaphragm 34 (FIG. 1) to yield their respective differential output voltages 168, 170, 172, 174 ($V_1$, $V_2$, $V_3$, $V_4$). Thus, first Wheatstone bridge 52 produces first output voltage 168, $V_1$, across first and second output nodes 82, 84. Second Wheatstone bridge 54 produces second output voltage 170, $V_2$, across third and fourth output nodes 106, 108. Third Wheatstone bridge 56 produces third output voltage 172, $V_3$, across fifth and sixth output nodes 132, 134. And, fourth Wheatstone bridge 58 produces fourth output voltage 174, $V_4$, across seventh and eighth output nodes 156, 158.

Thus, in charge state 184, first and second switches 214, 216 of first, second, third, and fourth switched capacitor structures 200, 202, 204, 206 connect each capacitor 208 to its associated one of first, second, third, and fourth Wheatstone bridges 52, 54, 56, 58. Accordingly, each capacitor 208 of first, second, third, and fourth switched capacitor structures 200, 202, 204, 206 charges to the voltage level (e.g., output voltage 168, 170, 172, 174) of its associated one of first, second, third, and fourth Wheatstone bridges 52, 54, 56, 58.

Figure 6:
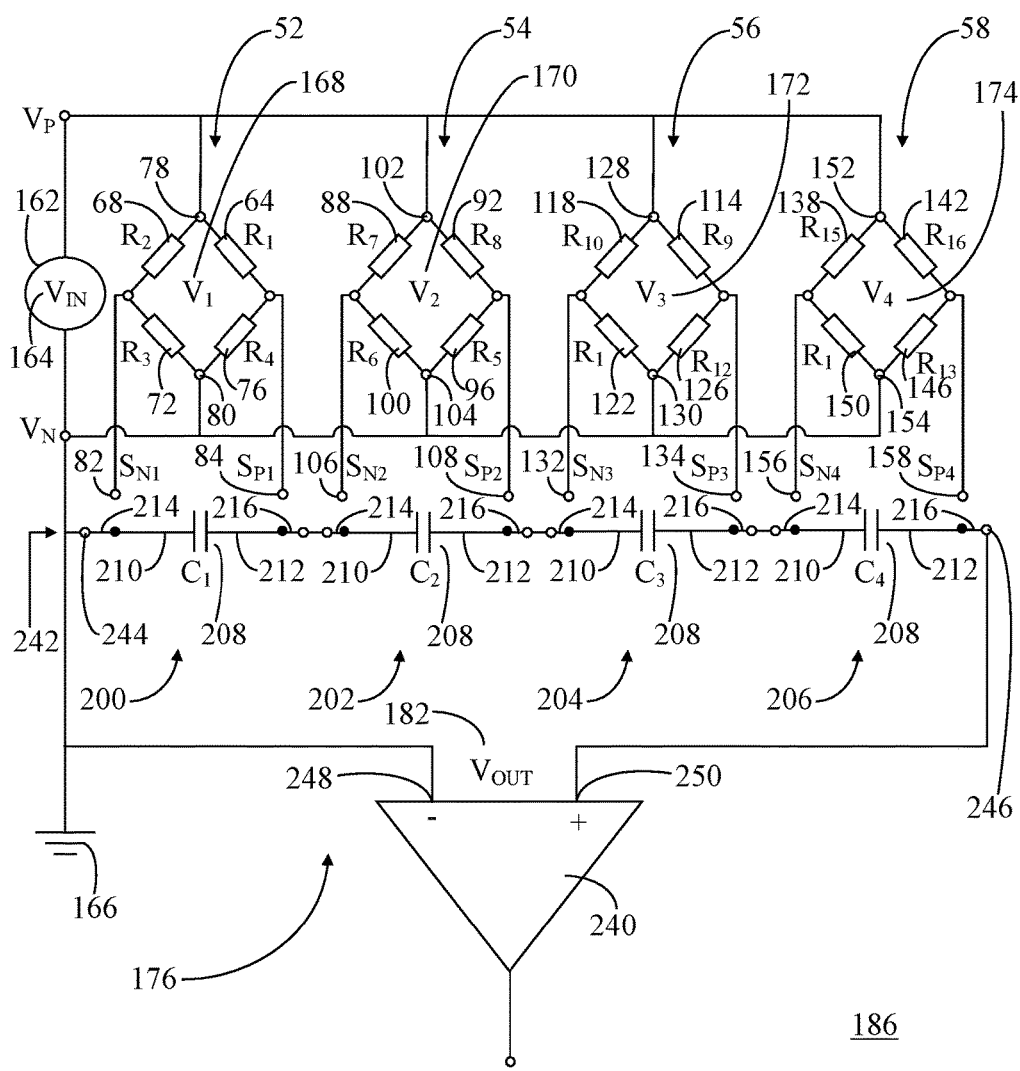
FIG. 6 shows the circuit diagram of FIG. 5 in which the signal interface circuit is in a readout state in accordance with the embodiment.

Referring now to FIG. 6, FIG. 6 shows the circuit diagram of FIG. 5 for pressure sensing portion 24 and signal interface circuit 176 in readout state 186. Again, FIG. 6 shows first, second, third, and fourth Wheatstone bridges 52, 54, 56, 58 of pressure sensing portion 24 and their corresponding first, second, third, and fourth switched capacitor structures 200, 202, 204, 206. Once capacitors 208 ($C_1$, $C_2$, $C_3$, $C_4$) of first, second, third, and fourth switched capacitor structures 200, 202, 204, 206 are fully charged in charge state 184 (FIG. 5), first and second switches 214, 216 toggle to readout state 186.

In readout state 186, first and second switches 214, 216 of each of first, second, third, and fourth switched capacitor structures 200, 202, 204, 206 are switched to disconnect each of first, second, third, and fourth Wheatstone bridges 52, 54, 56, 68 from its respective capacitor 208 ($C_1$, $C_2$, $C_3$, $C_4$). Additionally, first and second switches 214, 216 are toggled to interconnect each capacitor 208 ($C_1$, $C_2$, $C_3$, $C_4$) in a series chain 242. In the illustrated series chain 242, first terminal 210 of a first capacitor 208 ($C_1$) is a first end 244 of series chain 242 and is coupled to ground 166. Second terminal 212 of first capacitor 208 ($C_1$) is connected to first terminal 210 of a second capacitor 208 ($C_2$). Second terminal 212 of second capacitor 208 ($C_2$) is connected to first terminal 210 of a third capacitor 208 ($C_3$). Second terminal 212 of third capacitor 208 ($C_3$) is connected to first terminal 210 of a fourth capacitor 208 ($C_4$). Second terminal 212 of fourth capacitor 208 ($C_4$) is a second end 246 of series chain 242.

In general, readout voltage 182 is provided between first and second ends 244, 246 of series chain 242. Accordingly, when capacitors 208 ($C_1$, $C_2$, $C_3$, $C_4$) are interconnected in series chain 242, output voltages 168, 170, 172, 174 across capacitors 208 ($C_1$, $C_2$, $C_3$, $C_4$) will add and provide a readout voltage 182 that is equivalent to the sum of the individual output voltages 168, 170, 172, 174. First end 244 of series chain 242 may be coupled to a first terminal 248 of amplifier 240 and second end 246 of series chain 242 may be coupled to a second terminal 250 of amplifier 240. Thus, readout voltage 182 may be provided to amplifier 240.

A cycle of charge state 184 and readout state 186 may be repeated at a desired sampling rate for pressure sensor system 20 (FIG. 1) in accordance with sampling frequency 188 (FIG. 3) of switch state circuit 178 (FIG. 3). Capacitance values for capacitors 208 ($C_1$, $C_2$, $C_3$, $C_4$) may be selected to be high enough to swamp out any parasitic capacitances that may exist, but small enough so that their time constants (i.e., the amount of time taken for a capacitor to charge or discharge to within a certain percentage of its maximum supply value) do not adversely impact sampling frequency 188 of pressure sensor system 20.

The multiple Wheatstone bridge configuration of pressure sensor system 20, with all of Wheatstone bridges 52, 54, 56, 58 powered in parallel from the same voltage supply 162, enables a typical approach for biasing a sensing Wheatstone bridge. Further, each of Wheatstone bridges 52, 54, 56, 58 is tied to a common potential, e.g., system ground 166, which anchors Wheatstone bridges 52, 54, 56, 58 for system stability. Still further, the output voltages from the multiple Wheatstone bridges 52, 54, 56, 58 are electrically isolated from one another so that there is little to no potential for crosstalk between them.

The charge and readout interface scheme of signal interface circuit 176 provides a relatively straightforward technique for summing the voltage outputs of the individual Wheatstone bridges. This charge and readout interface scheme can be readily scaled to various quantities of sensing Wheatstone bridges having identical or non-identical configurations. Further, the individual voltage outputs need not be collected using a summing amplifier which would otherwise require additional power consumption.

Thus, embodiments disclosed herein entail a signal interface circuit for a sensor, a pressure sensor system that includes the signal interface circuit, and methodology for enhanced system performance. An embodiment of a signal interface circuit for a sensor, the sensor including a first group of sense elements coupled to one another to form a first Wheatstone bridge configured to produce a first output voltage across a first and second output nodes of the first Wheatstone bridge, the sensor further including a second group of sense elements coupled to one another to form a second Wheatstone bridge configured to produce a second output voltage across third and fourth output nodes of the second Wheatstone bridge, and the signal interface circuit comprising a first switched capacitor structure associated with the first Wheatstone bridge, the first switched capacitor structure comprising a first capacitor having a first terminal and a second terminal, a first switch configured to selectively interconnect the first output node with the first terminal of the first capacitor, and a second switch configured to selectively interconnect the second output node with the second terminal of the first capacitor. The signal interface circuit further comprises a second switched capacitor structure associated with the second Wheatstone bridge, the second switched capacitor structure comprising a second capacitor having a third terminal and a fourth terminal, a third switch configured to selectively interconnect the third output node with the third terminal of the second capacitor, and a fourth switch configured to selectively interconnect the fourth output node with the fourth terminal of the second capacitor.

An embodiment of a pressure sensor system comprises a diaphragm suspended across a cavity of a substrate, a first group of sense elements provided in the diaphragm, the sense elements of the first group being coupled to one another to form a first Wheatstone bridge, the first Wheatstone bridge having a first and second output nodes, a second group of sense elements provided in the diaphragm, the sense elements of the second group being coupled to one another to form a second Wheatstone bridge, the second Wheatstone bridge having a third and fourth output nodes, and a signal interface circuit. The signal interface circuit comprises a first switched capacitor structure associated with the first Wheatstone bridge, the first switched capacitor structure comprising a first capacitor having a first terminal and a second terminal, a first switch configured to selectively interconnect the first output node with the first terminal of the first capacitor, and a second switch configured to selectively interconnect the second output node with the second terminal of the first capacitor. The signal interface circuit further comprises a second switched capacitor structure associated with the second Wheatstone bridge, the second switched capacitor structure comprising a second capacitor having a third terminal and a fourth terminal, a third switch configured to selectively interconnect the third output node with the third terminal of the second capacitor, and a fourth switch configured to selectively interconnect the fourth output node with the fourth terminal of the second capacitor.

An embodiment of a method for obtaining a readout voltage from a sensor system having sensor and a signal interface circuit connected to the sensor, the sensor including multiple groups of sense elements coupled to one another to form multiple Wheatstone bridges, each of the Wheatstone bridges being configured to produce an output voltage, and the signal interface circuit including switched capacitor structures, one each of the switched capacitor structures being associated with one each of the Wheatstone bridges, wherein the method comprises in a charge state, interconnecting each of the switched capacitor structures with its associated one of the Wheatstone bridges to charge a capacitor of each of the switched capacitor structures, the capacitor being charged to the output voltage from the one of the Wheatstone bridges, and in a readout state, disconnecting each of the switched capacitor structures from its associated one of the Wheatstone bridges. The method further comprising in the readout state, interconnecting the capacitor of each of the switched capacitor structures in a series chain of connected capacitors, and in the readout state, detecting the readout voltage from the series chain of the connected capacitors, the readout voltage being equivalent to a summation of the output voltage stored in each the capacitor.

The pressure sensor system, including a multiple Wheatstone bridge configuration of sense elements and the signal interface circuit, can enable enhanced sensor performance in terms of increased sensitivity, improved SNR performance, and improved robustness to process variation. The array of switched capacitors and a two-stage charge and readout interface scheme of the signal interface circuit enables relatively straightforward methodology for summing the voltage outputs of the multiple individual Wheatstone bridges. Further, this charge and readout interface scheme can be readily scaled to various quantities of sensing Wheatstone bridges having identical or non-identical configurations. Additionally, although an embodiment described herein entails a pressure sensor system, the charge and readout interface scheme of the signal interface circuit can be adapted for other systems that include multiple bridges for which voltage outputs may be combined to yield enhanced signal output.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A signal interface circuit for a sensor, said sensor including a first group of sense elements coupled to one another to form a first Wheatstone bridge configured to produce a first output voltage across a first and second output nodes of said first Wheatstone bridge, said sensor further including a second group of sense elements coupled to one another to form a second Wheatstone bridge configured to produce a second output voltage across third and fourth output nodes of said second Wheatstone bridge, and said signal interface circuit comprising:
   a first switched capacitor structure associated with said first Wheatstone bridge, said first switched capacitor structure comprising a first capacitor having a first terminal and a second terminal, a first switch configured to selectively interconnect said first output node with said first terminal of said first capacitor, and a second switch configured to selectively interconnect said second output node with said second terminal of said first capacitor; and
   a second switched capacitor structure associated with said second Wheatstone bridge, said second switched capacitor structure comprising a second capacitor having a third terminal and a fourth terminal, a third switch configured to selectively interconnect said third output node with said third terminal of said second capacitor, and a fourth switch configured to selectively interconnect said fourth output node with said fourth terminal of said second capacitor.

2. The signal interface circuit of claim 1 further comprising a switch state element configured to communicate with said first and second switched capacitor structures, said switch state element being configured to switch said first, second, third, and fourth switches between a charge state and a readout state.

3. The signal interface circuit of claim 2 wherein:
   in said charge state, said first switch interconnects said first output node and said first terminal, said second switch interconnects said second output node and said second terminal, and said first output voltage charges said first capacitor; and
   in said charge state, said third switch interconnects said third output node and said third terminal, said fourth switch interconnects said fourth output node and said fourth terminal, and said second output voltage charges said second capacitor.

4. The signal interface circuit of claim 3 wherein in said readout state, each of said first, second, third, and fourth switches is switched to disconnect said first and second Wheatstone bridges from said first and second capacitors and to interconnect said first and second capacitors in a series chain.

5. The signal interface circuit of claim 4 wherein said series chain of said first and second capacitors has a first end and a second end, said first end being coupled to ground and a readout voltage is provided between said first and said second ends of said series chain of said first and second capacitors.

6. The signal interface circuit of claim 4 wherein when said first and second capacitors are interconnected in said series chain, said first and second output voltages across said first and second capacitors are summed to provide a readout voltage.

7. The signal interface circuit of claim 1 wherein said sensor includes a third group of sense elements coupled to one another to form a third Wheatstone bridge configured to produce a third output voltage across a fifth and sixth output nodes of said third Wheatstone bridge, and said signal interface circuit further comprises:
   a third switched capacitor structure associated with said third Wheatstone bridge, said third switched capacitor structure comprising:

a third capacitor having a fifth terminal and a sixth terminal;
a fifth switch configured to selectively interconnect said fifth output node with said fifth terminal of said third capacitor; and
a sixth switch configured to selectively interconnect said sixth output node with said sixth terminal of said third capacitor.

8. The signal interface circuit of claim 7 wherein:
when said first and second switches interconnect said first Wheatstone bridge with said first capacitor, said first output voltage charges said first capacitor;
when said third and fourth switches interconnect said second Wheatstone bridge with said second capacitor, said second output voltage charges said second capacitor;
when said fifth and sixth switches interconnect said third Wheatstone bridge with said third capacitor, said third output voltage charges said second capacitor; and
said first, second, third, fourth, fifth, and sixth switches are configured to disconnect said first, second and third Wheatstone bridges from said first, second, and third capacitors and to interconnect said first, second, and third capacitors in a series chain to provide a readout voltage that equivalent to a summation of said first, second, and third output voltages across said first, second, and third capacitors.

9. The signal interface circuit of claim 1 wherein:
said first Wheatstone bridge has a first positive input node and a first negative input node;
said second Wheatstone bridge has a second positive input node and a second negative input node; and
said sensor further comprises a voltage source interconnected between said first positive input node and said first negative input node of said first Wheatstone bridge, said voltage source further being interconnected between said second positive input node and said second negative input node of said second Wheatstone bridge, and said voltage source being configured to deliver an input voltage to said each of said first and second Wheatstone bridges.

10. The signal interface circuit of claim 1 wherein said sensor comprises a pressure sensor and said first and second groups of sense elements are provided in a diaphragm of said pressure sensor.

11. The signal interface circuit of claim 10 wherein said pressure sensor and said signal interface circuit are combined in an integrated piezoresistive transducer package in which said sense elements are piezoresistors, and said pressure sensor is directly incorporated with an application specific integrated circuit (ASIC) die containing said signal interface circuit.

12. A pressure sensor system comprising:
a diaphragm suspended across a cavity of a substrate;
a first group of sense elements provided in said diaphragm, said sense elements of said first group being coupled to one another to form a first Wheatstone bridge, said first Wheatstone bridge having a first and second output nodes;
a second group of sense elements provided in said diaphragm, said sense elements of said second group being coupled to one another to form a second Wheatstone bridge, said second Wheatstone bridge having a third and fourth output nodes; and
a signal interface circuit comprising:
a first switched capacitor structure associated with said first Wheatstone bridge, said first switched capacitor structure comprising a first capacitor having a first terminal and a second terminal, a first switch configured to selectively interconnect said first output node with said first terminal of said first capacitor, and a second switch configured to selectively interconnect said second output node with said second terminal of said first capacitor; and
a second switched capacitor structure associated with said second Wheatstone bridge, said second switched capacitor structure comprising a second capacitor having a third terminal and a fourth terminal, a third switch configured to selectively interconnect said third output node with said third terminal of said second capacitor, and a fourth switch configured to selectively interconnect said fourth output node with said fourth terminal of said second capacitor.

13. The pressure sensor system of claim 12 further comprising a switch state element configured to communicate with said first and second switched capacitor structures, said switch state element being configured to switch said first, second, third, and fourth switches between a charge state and a readout state.

14. The pressure sensor system of claim 13 wherein:
in said charge state, said first switch interconnects said first output node and said first terminal, said second switch interconnects said second output node and said second terminal, and said first output voltage charges said first capacitor;
in said charge state, said third switch interconnects said third output node and said third terminal, said fourth switch interconnects said fourth output node and said fourth terminal, and said second output voltage charges said second capacitor; and
in said readout state, each of said first, second, third, and fourth switches is switched to disconnect said first and second Wheatstone bridges from said first and second capacitors and to interconnect said first and second capacitors in a series chain.

15. The pressure sensor system of claim 14 wherein said series chain of said first and second capacitors has a first end and a second end, said first end being coupled to ground and a readout voltage is provided between said first and said second ends of said series chain of said first and second capacitors.

16. The pressure sensor system of claim 14 wherein when said first and second capacitors are interconnected in said series chain, said first and second output voltages across said first and second capacitors are summed to provide a readout voltage.

17. The pressure sensor system of claim 12 wherein:
said first Wheatstone bridge has a first positive input node and a first negative input node;
said second Wheatstone bridge has a second positive input node and a second negative input node; and
said sensor further comprises a voltage source interconnected between said first positive input node and said first negative input node of said first Wheatstone bridge, said voltage source further being interconnected between said second positive input node and said second negative input node of said second Wheatstone bridge, and said voltage source being configured to deliver an input voltage to said each of said first and second Wheatstone bridges.

18. The pressure sensor system of claim 12 wherein said pressure sensor and said signal interface circuit are combined in an integrated piezoresistive transducer package in which said sense elements are piezoresistors, and said pressure sensor is directly incorporated with an application specific integrated circuit (ASIC) die containing said signal interface circuit.

19. A method for obtaining a readout voltage from a sensor system having a sensor and a signal interface circuit connected to said sensor, said sensor including multiple groups of sense elements coupled to one another to form multiple Wheatstone bridges, each of said Wheatstone bridges being configured to produce an output voltage, and said signal interface circuit including switched capacitor structures, one each of said switched capacitor structures being associated with one each of said Wheatstone bridges, wherein said method comprises:

in a charge state, interconnecting each of said switched capacitor structures with its associated one of said Wheatstone bridges to charge a capacitor of said each of said switched capacitor structures, said capacitor being charged to said output voltage from said one of said Wheatstone bridges;

in a readout state, disconnecting said each of said switched capacitor structures from its associated one of said Wheatstone bridges in said readout state, interconnecting said capacitor of said each of said switched capacitor structures in a series chain of connected capacitors; and in said readout state, detecting said readout voltage from said series chain of said connected capacitors, said readout voltage being equivalent to a summation of said output voltage stored in each said capacitor.

20. The method of claim 19 wherein said each of said Wheatstone bridges produces said output voltage across first and second output nodes, said each of said switched capacitor structures includes a first switch and a second switch, each said capacitor includes a first terminal and a second terminal, wherein:

when in said charge state, said first switch interconnects said first output node and said first terminal, said second switch interconnects said second output node and said second terminal, and said output voltage produced by said one of said Wheatstone bridges charges said capacitor; and when in said readout state, each of said first and second switches is switched to disconnect said first and second output nodes from said first and second terminals and to interconnect said capacitor of said each of said capacitor structures in said series chain to detect said readout voltage.

\* \* \* \* \*